United States Patent [19]
Ishio et al.

[11] Patent Number: 6,065,341
[45] Date of Patent: May 23, 2000

[54] SEMICONDUCTOR PHYSICAL QUANTITY SENSOR WITH STOPPER PORTION

[75] Inventors: Seiichiro Ishio, Handa; Minekazu Sakai, Kariya; Kenichi Ao, Tokai, all of Japan

[73] Assignee: Denso Corporation, Kariya, Japan

[21] Appl. No.: 09/209,414

[22] Filed: Dec. 11, 1998

[30] Foreign Application Priority Data

Feb. 18, 1998 [JP] Japan ................................... 10-036325
Feb. 18, 1998 [JP] Japan ................................... 10-036326

[51] Int. Cl.[7] ................................................. G01P 15/125
[52] U.S. Cl. ..................................... 73/514.32; 73/514.38; 361/283.3
[58] Field of Search ........................... 73/514.32, 514.18, 73/514.01, 514.35, 777, 514.16, 514.21, 514.38; 361/280, 283.1, 283.2, 283.4, 283.3

[56] References Cited

U.S. PATENT DOCUMENTS

| | | | |
|---|---|---|---|
| 5,121,633 | 6/1992 | Murakami et al. | 73/517 R |
| 5,367,429 | 11/1994 | Tsuchitani et al. | 361/280 |
| 5,504,356 | 4/1996 | Takeuchi et al. | 257/254 |
| 5,542,295 | 8/1996 | Howe et al. | 73/514.18 |
| 5,572,057 | 11/1996 | Yamamoto et al. | 257/417 |
| 5,622,633 | 4/1997 | Ohtsuka et al. | 438/53 |
| 5,627,397 | 5/1997 | Kano et al. | 257/417 |
| 5,631,422 | 5/1997 | Sulzberger et al. | 73/514.32 |
| 5,646,347 | 7/1997 | Weiblen et al. | 73/514.32 |
| 5,756,901 | 5/1998 | Kurle et al. | 73/777 |
| 5,824,608 | 10/1998 | Gotoh et al. | 438/745 |

FOREIGN PATENT DOCUMENTS

| | | |
|---|---|---|
| 6-151889 | 5/1994 | Japan . |
| 6-347474 | 12/1994 | Japan . |
| 8-043436 | 2/1996 | Japan . |
| 8-111534 | 4/1996 | Japan . |
| 8-139338 | 5/1996 | Japan . |
| 8-335705 | 12/1996 | Japan . |
| 9-127151 | 5/1997 | Japan . |
| 9-211022 | 8/1997 | Japan . |
| 9-260745 | 10/1997 | Japan . |

*Primary Examiner*—Hezron Williams
*Assistant Examiner*—Helen C. Kwok
*Attorney, Agent, or Firm*—Pillsbury Madison & Sutro LLP

[57] ABSTRACT

A mass portion of a movable portion is supported by an anchor portion protruding from a substrate through a beam portion. A stopper portion fixed to the substrate through another anchor portion is disposed on a side opposite to the mass portion with respect to the beam portion to define a gap with the beam portion. The stopper portion is electrically connected to the beam portion through the anchor portions. Accordingly, the movable portion is restricted from being displaced in a direction generally parallel to a surface of the substrate, and a movable electrode of the movable portion is prevented from being attached to the fixed electrode.

30 Claims, 11 Drawing Sheets

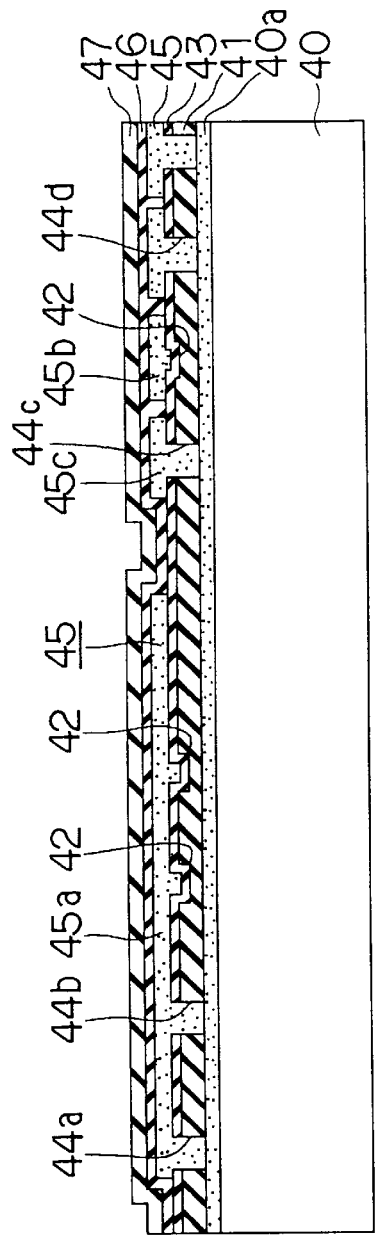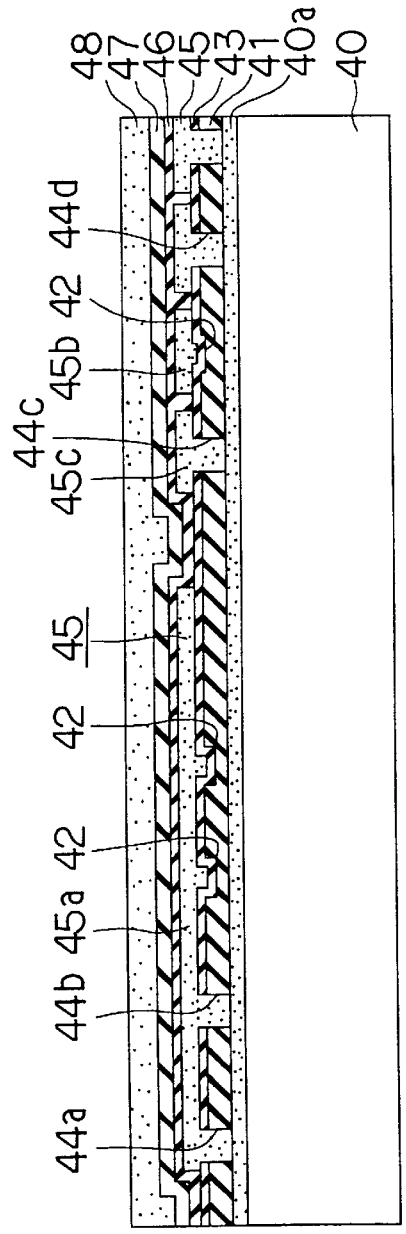

SEMICONDUCTOR PHYSICAL QUANTITY SENSOR WITH STOPPER PORTION

CROSS REFERENCE TO RELATED APPLICATIONS

This application is based upon and claims the benefit of priority of the prior Japanese Patent Applications No. 10-36325, filed on Feb. 18, 1998, and No. 10-36326, filed on Feb. 18, 1998, the contents of which are incorporated herein by reference.

BACKGROUND OF THE INVENTION

1. Field of the Invention

This invention relates to a semiconductor sensor having a movable portion of a beam structure for detecting a physical quantity such as acceleration, yaw rate, vibration, or the like.

2. Description of the Related Art

A differential capacitance type semiconductor sensor detects a physical quantity such as acceleration based on a change in capacitance between a movable electrode and a fixed electrode. A conventional method for manufacturing the sensor has a problem that, in a dry step which is carried out after the movable electrode and the fixed electrode are formed, the movable electrode is liable to be attached to the fixed electrode facing thereto due to surface tension of demineralized water intervening therebetween, and a beam is liable to be attached to a substrate facing thereto due to the same reason. In addition, when the sensor detects the acceleration, if acceleration is produced with a magnitude larger than a specific value that is determined by a spring constant of the beam, the movable electrode is attracted to the fixed electrode. The attracted movable electrode is attached to the fixed electrode by a van der Waals force even after the acceleration is decreased.

To solve the problem, U.S. Pat. No. 5,542,295 proposes a sensor. As shown in FIG. 1, the sensor has a stopper portion 203 protruding from a beam portion 201 toward a weight portion 202 so that a gap between the beam portion 201 and the weight portion 202 is smaller than that between a movable electrode and a fixed electrode. Accordingly, the movable electrode is prevented from being attached to the fixed electrode.

However, as indicated by a dotted line in FIG. 2, the stopper portion 203 readily deforms by displacement of the beam portion 201 so that the gap between the beam portion 201 and the weight portion 202 is largely increased. Accordingly, the movable electrode can move more than the gap between the movable electrode and the fixed electrode such that it is attached to the fixed electrode. This kind of problem occurs prominently in the differential capacitance type physical semiconductor sensor in which the gap between the movable electrode and the fixed electrode is very small, and especially when the beam portion 201 is displaced not only in a substrate surface direction but also in a direction perpendicular to the substrate surface direction as in a resonant state.

On the other hand, JP-A-6-347474 proposes a sensor in which one of a movable electrode and a fixed electrode has a protrusion as a stopper so that a contact area between the movable electrode and the fixed electrode decreases and so that the movable electrode is prevented from being attached to the fixed electrode. However, when the protrusion is directly formed with the movable electrode or the fixed electrode, a capacitance between the movable electrode and the fixed electrode can readily change so that a change in capacitance cannot be precisely detected. Further, when a potential difference between the movable electrode and the fixed electrode is produced, the movable electrode can be attached to the fixed electrode by an electrostatic force produced therebetween.

Further, JP-A-9-211022 proposes an acceleration sensor in which a substrate has a protrusion facing a beam portion for preventing the beam portion from being attached to the substrate. However, there is a case that not the beam portion but a movable electrode is attached to the substrate by an electrostatic force produced between the movable electrode and the substrate. Therefore, it is not sufficient that the substrate has the protrusion only at the lower portion of the the beam portion.

SUMMARY OF THE INVENTION

The present invention has been made in view of the above problems. An object of the present invention is to provide a semiconductor sensor for detecting a physical quantity, having a structure capable of preventing a movable portion from being attached to a fixed electrode and to a substrate even when the movable portion is deformed in various directions.

In a semiconductor sensor according to the present invention, a movable portion has a movable electrode, a mass portion, and a beam portion, and the mass portion is supported by a first anchor portion of a substrate through the beam portion. A stopper portion for restricting displacement of the movable portion is fixed to the substrate through a second anchor portion and is electrically connected to the beam portion through the first and second anchor portions. Accordingly, the movable electrode, which is displaced together with the mass portion, is prevented from being attached to a fixed electrode. Because no potential difference is produced between the stopper portion and the movable portion, the movable portion is prevented from being attached to the stopper portion by an electrostatic force produced therebetween.

When the beam portion is a polygonally shaped beam including an inner beam cavity therein, the stopper portion can be disposed in the inner beam cavity. Preferably, the stopper portion is disposed on a side opposite to the mass portion with respect to the beam portion. More preferably, the stopper portion has a protrusion protruding toward the beam portion.

To prevent the movable portion from being attached to the substrate, the substrate can have an electrode pattern facing the movable portion with a gap interposed therebetween and electrically connected to the movable portion to have an electric potential equal to that of the movable portion. Preferably, the electrode pattern faces all of the mass portion, the movable electrode, and the beam portion. More preferably, the electrode pattern has the same shape as that of the movable portion. Accordingly, the movable portion can be securely prevented from being attached to the substrate.

The electrode pattern can have a plurality of protrusions facing the movable portion. The semiconductor sensor can have the electrode pattern of the substrate and the stopper portion, both of which are electrically connected to the movable portion. Accordingly, the movable portion can be prevented from being attach not only to the fixed electrode but also to the substrate.

BRIEF DESCRIPTION OF THE DRAWINGS

Other objects and features of the present invention will become more readily apparent from a better understanding of the preferred embodiments described below with reference to the following drawings;

FIGS. 9–15 are cross-sectional views for explaining a process of manufacturing the acceleration sensor in a stepwise manner in the first embodiment;

DETAILED DESCRIPTION OF THE PREFERRED EMBODIMENTS (First Embodiment)

Figure 1:
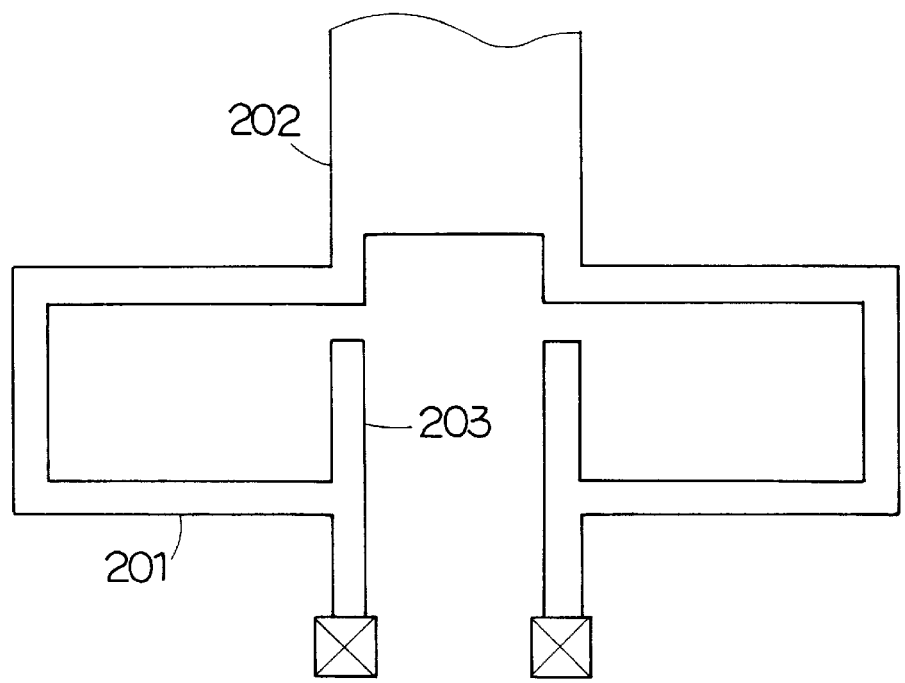
FIG. 1 is a plan view partially showing a semiconductor sensor according to a prior art.
Figure 2:
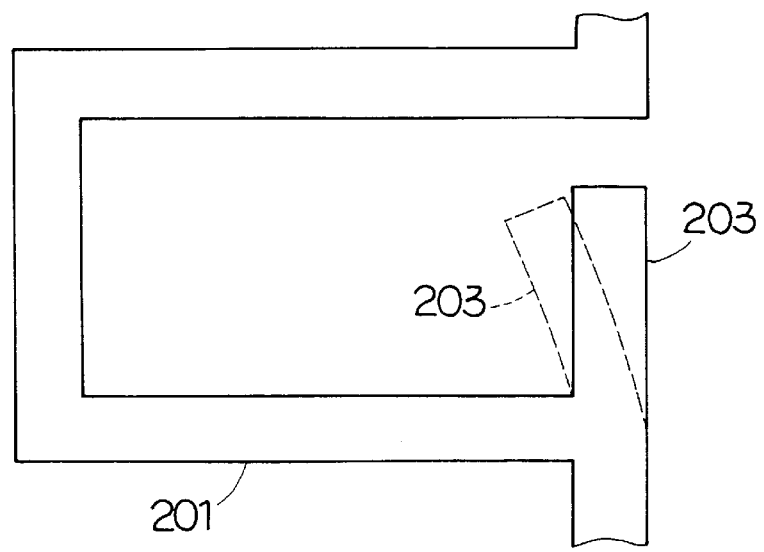
FIG. 2 is a plan view for explaining a resonance state of the sensor shown of FIG. 1.
Figure 3:
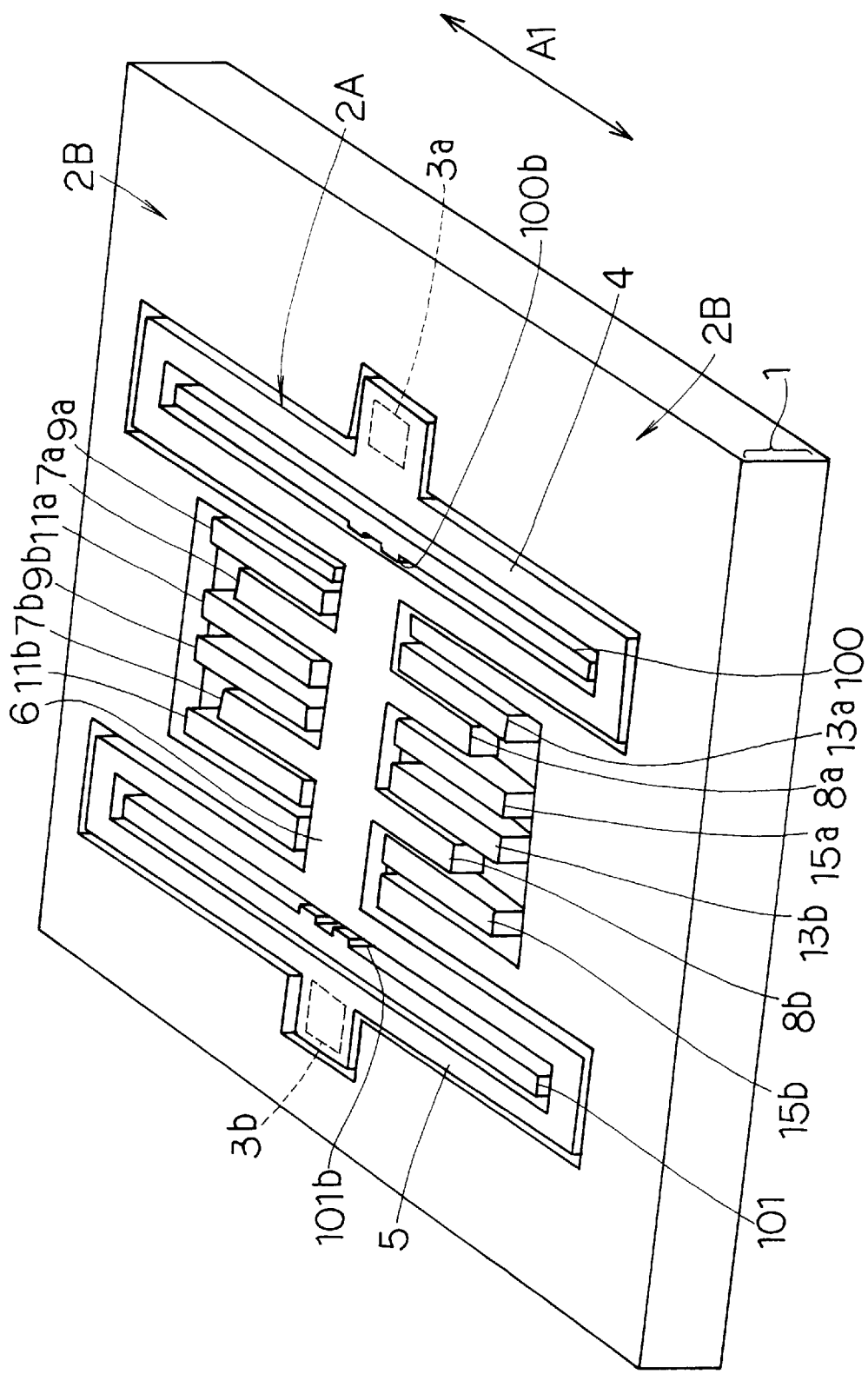
FIG. 3 is a perspective view showing an acceleration sensor in a first preferred embodiment.
Figure 4:
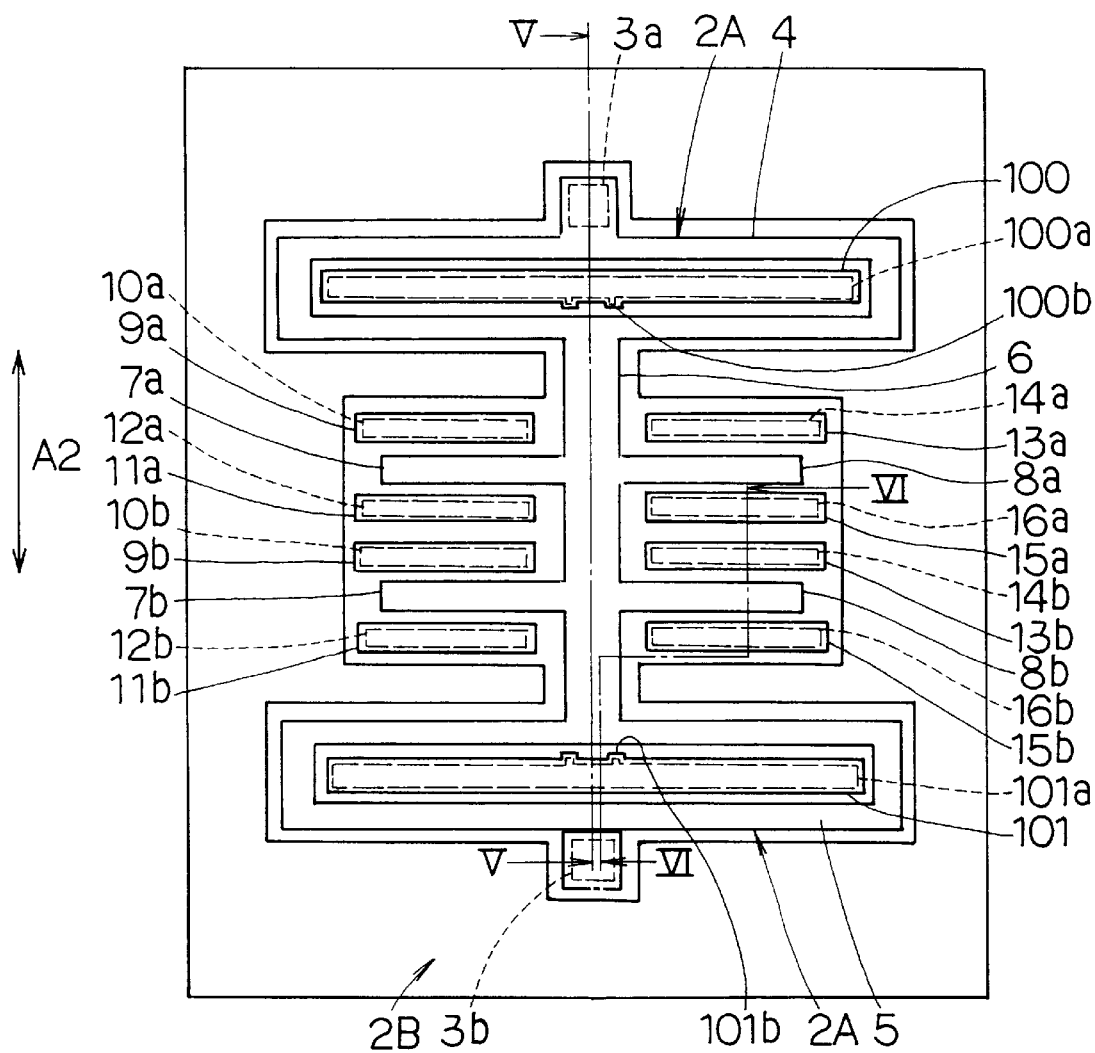
FIG. 4 is a plan view showing the acceleration sensor of FIG. 3.
Figure 5:
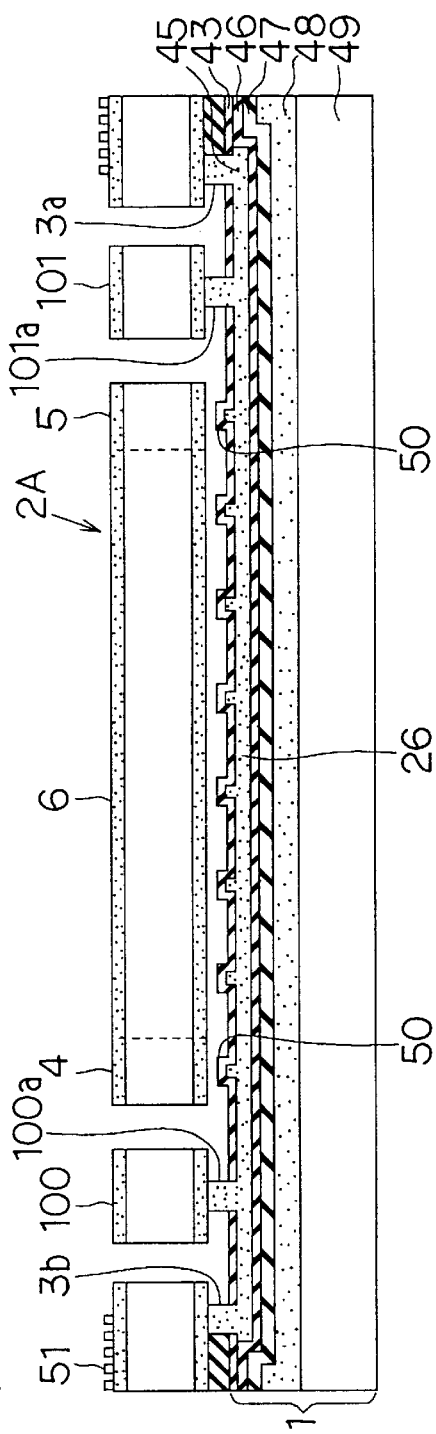
FIG. 5 is a cross-sectional view taken along a V—V line in FIG. 4.

Referring to FIGS. 3–5, a semiconductor acceleration sensor in a first preferred embodiment has a beam structure (movable portion) 2A and a fixed portion 2B provided on a silicon substrate 1. The beam structure 2A and the fixed potion 2B are formed by isolating a single crystal silicon layer by grooves. As shown in FIGS. 4 and 5, the beam structure 2A is supported by two anchor portions 3a, 3b protruding from the substrate 1, and is disposed above the substrate 1 to make a specific gap with the fixed portion 2B. The anchor portions 3a, 3b are formed from a polysilicon thin film.

The anchor portions 3a, 3b directly and respectively support beam portions 4, 5 of the beam structure 2A. Each of the beam portions 4, 5 has a generally rectangular shape (polygonal shape) with a longitudinal direction extending in a direction A1 in FIG. 3, and with an inner beam cavity opened inside of the rectangular shape. Accordingly, each of the beam portions 4, 5 has two bent type beams for permitting the beam structure 2A to move.

Stopper portions 100, 101 are provided in the inner beam cavity of the beam portions 4, 5 to restrict movement of the beam portions 4, 5 in a direction A2 in FIG. 4. Specifically, as shown in FIG. 5, the stopper portions 100, 101 are isolated from the beam structure 2A and fixed to the substrate 1 by anchor portions 100a, 101a to be part of the fixed portion 2B. The stopper portions 100, 101 are electrically connected to the beam structure 2A through the anchor portions 3a, 3b to be the same electrical potential as that of the beam structure 2A. Further, the stopper portions 100, 101 has protrusions 100b, 101b partially protruding therefrom to contact the beam portions 4, 5 at small contact areas. The protrusions 100b, 101b substantially serve as stoppers. The protrusions 100b, 101b make a specific gap (for example, 2 µm) with the beam portions 4, 5 so that the beam structure 2A does not move more than the specific gap.

A rectangular weight portion (mass portion) 6 is provided between the beam portions 4, 5. The weight portion 6 can have through holes (not shown) for facilitating etching solution to be introduced into the gap between the weight portion 6 and the substrate 1 during an etching step. Two pole-like movable electrodes 7a, 7b protrude from a side wall (on a left side in FIG. 4) of the weight portion 6 at an equal interval in parallel with one another. Likewise, two pole-like movable electrodes 8a, 8b protrude from the other side wall (on a right side in FIG. 4) of the weight portion 6 at the equal interval in parallel with one another. Each of the movable electrodes 7a, 7b, 8a, 8b has a length in a range of 200 µm to 400 µm. The beam portions 4, 5, the weight portion 6, and the movable electrodes 7a, 7b, 8a, 8b are movably formed by partially or entirely removing a sacrifice oxide layer, which is described below, by etching. These parts constitute the movable portion.

Further, first fixed electrodes 9a, 9b and second fixed electrodes 11a, 11b are fixed to the upper surface of the substrate 1 on the side of the movable electrodes 7a, 7b with respect to the weight portion 6. The first fixed electrodes 9a, 9b are supported by anchor portions 10a, 10b protruding from the substrate 1 and face the movable electrodes 7a, 7b, respectively on the same side. The second fixed electrodes 11a, 11b are supported by anchor portions 12a, 12b protruding from the substrate 1, and face the movable electrodes 7a, 7b, respectively, on a side opposite to the first fixed electrodes 9a, 9b. The first and second fixed electrodes 9a, 9b, 11a, 11b are arranged at a generally equal interval with the movable electrodes 7a, 7b. The interval between one of the fixed electrodes and a corresponding one of the movable electrodes is larger than that between the beam portions 4, 5 and the stopper portions 100, 101, and is, for example, in a range of 2.5 µm to 3.0 µm.

Likewise, first fixed electrodes 13a, 13b and second fixed electrodes 15a, 15b are fixed to the upper surface of the substrate 1 on the side of the movable electrodes 8a, 8b with respect to the weight portion 6. The first fixed electrodes 13a, 13b are supported by anchor portions 14a, 14b, and face the movable electrodes 8a, 8b, respectively, on the same side. Further, the second fixed electrodes 15a, 15b are supported by anchor portions 16a, 16b and face the movable electrodes 8a, 8b on the side opposite to the first fixed electrodes 13a, 13b. In the first embodiment, each number of the movable electrodes, the first fixed electrodes, and the second fixed electrodes respectively disposed on the same side of the weight portion 6 is two; however, 30 to 100 movable electrodes and corresponding fixed electrodes can be disposed in practice. When the numbers of the movable electrodes and the fixed electrodes are increased, a capacity is increased so that it can be precisely detected.

Incidentally, electrode output portions (not shown) are provided on the substrate 1 so that an electrical potential corresponding to a change in capacitance between the movable electrodes and the fixed electrodes can be taken out from the electrode output portions. The electrode output portions are also supported by anchor portions protruding from the substrate 1.

Figure 6:
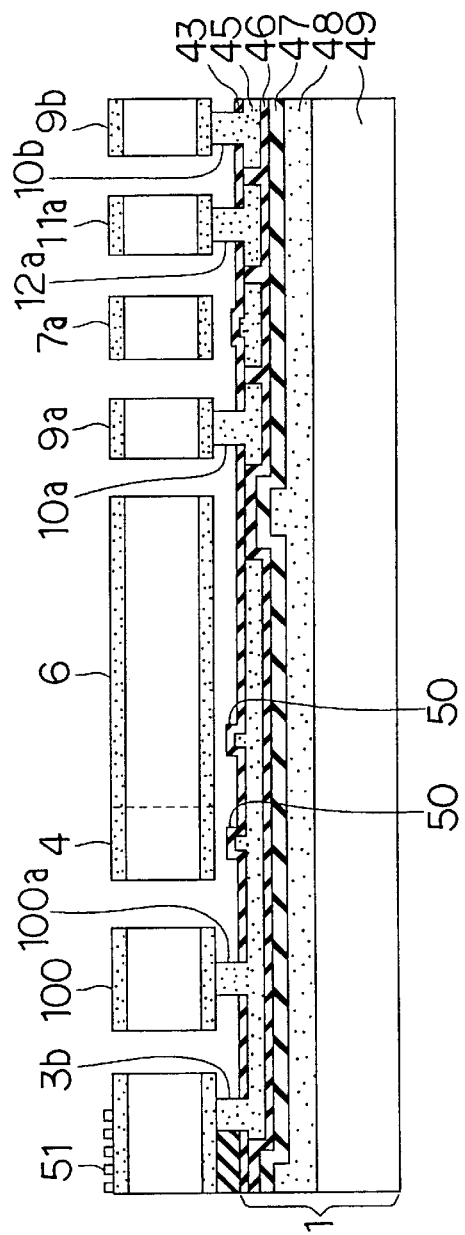
FIG. 6 is a cross-sectional view taken along a VI—VI line in FIG. 4.

As shown in FIGS. 5 and 6, the substrate 1 includes a polysilicon thin film 48 for bonding, a silicon oxide film 47, a silicon nitride film 46, a conductive thin film 45, and a silicon nitride film 43, which are laminated on a silicon substrate 49 in that order. The conductive thin film 45 is a polysilicon thin film doped with impurities such as phosphorus, and having a structure buried in the silicon nitride films 43, 46.

Figure 7:
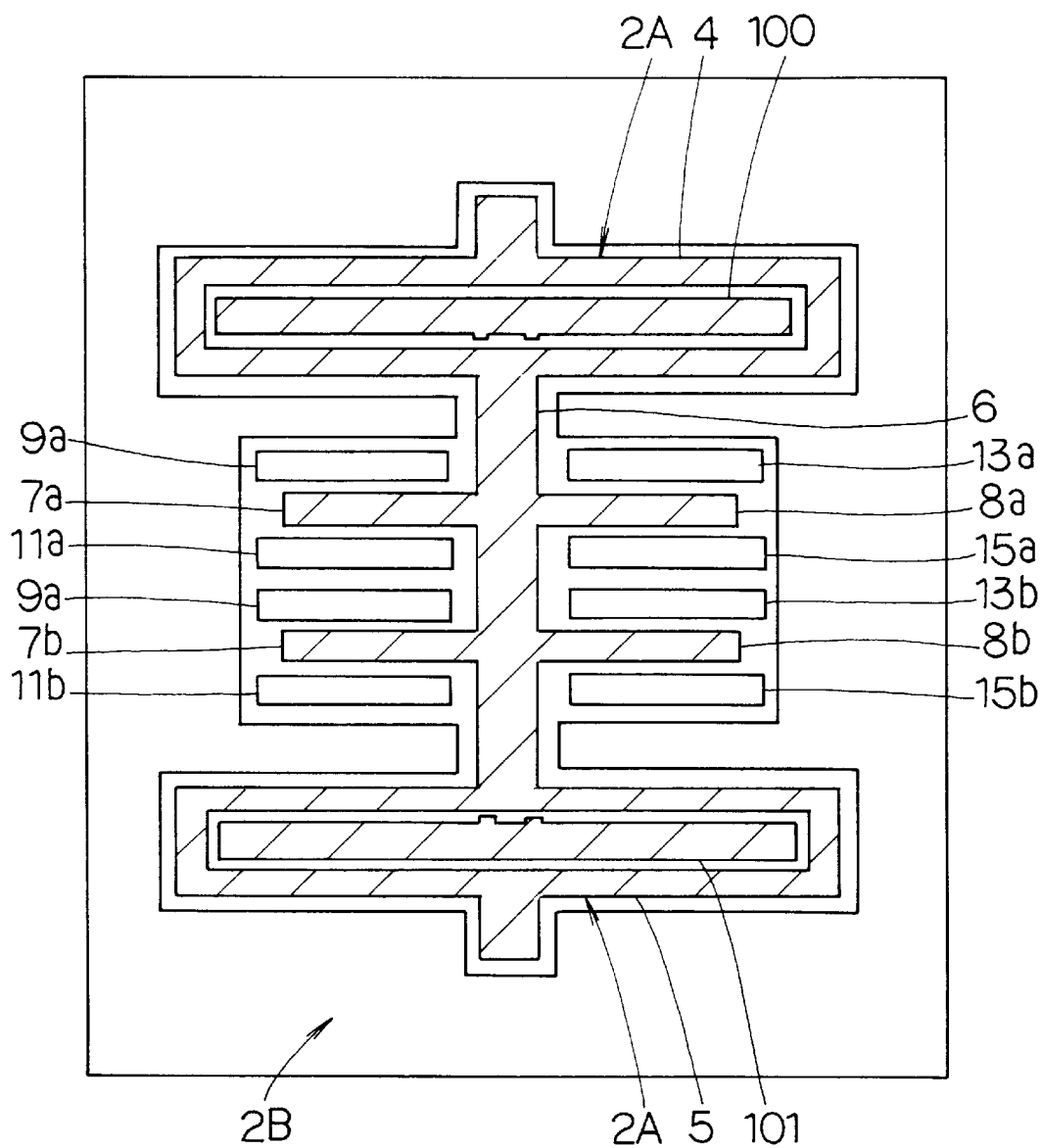
FIG. 7 is a plan view for showing a pattern of a lower electrode of the acceleration sensor.

As shown in FIGS. 5 and 6, the conductive thin film 45 forms the anchor portions 3a, 3b, 10a, 10b, 12a, 12b, 14a, 14b, 16a, 16b, 100a, 101a. The conductive thin film 45 further forms wiring segments electrically connecting the first fixed electrodes 9a, 9b and a corresponding one of the electrode output portions, the first fixed electrodes 13a, 13b and a corresponding one of the electrode output portions, the second fixed electrodes 11a, 11b and a corresponding one of the electrode output portions, and the second fixed electrodes 15a, 15b and a corresponding one of the electrode output portions, respectively. The conductive thin film 45 further forms a lower electrode (fixed electrode for compensating an electrostatic force) 26. In FIG. 7, the pattern of the lower electrode 26 is indicated by slant lines. As shown in the figure, the lower electrode 26 is provided to be opposed to the beam structure 2A provided above the substrate 1.

Figure 8:
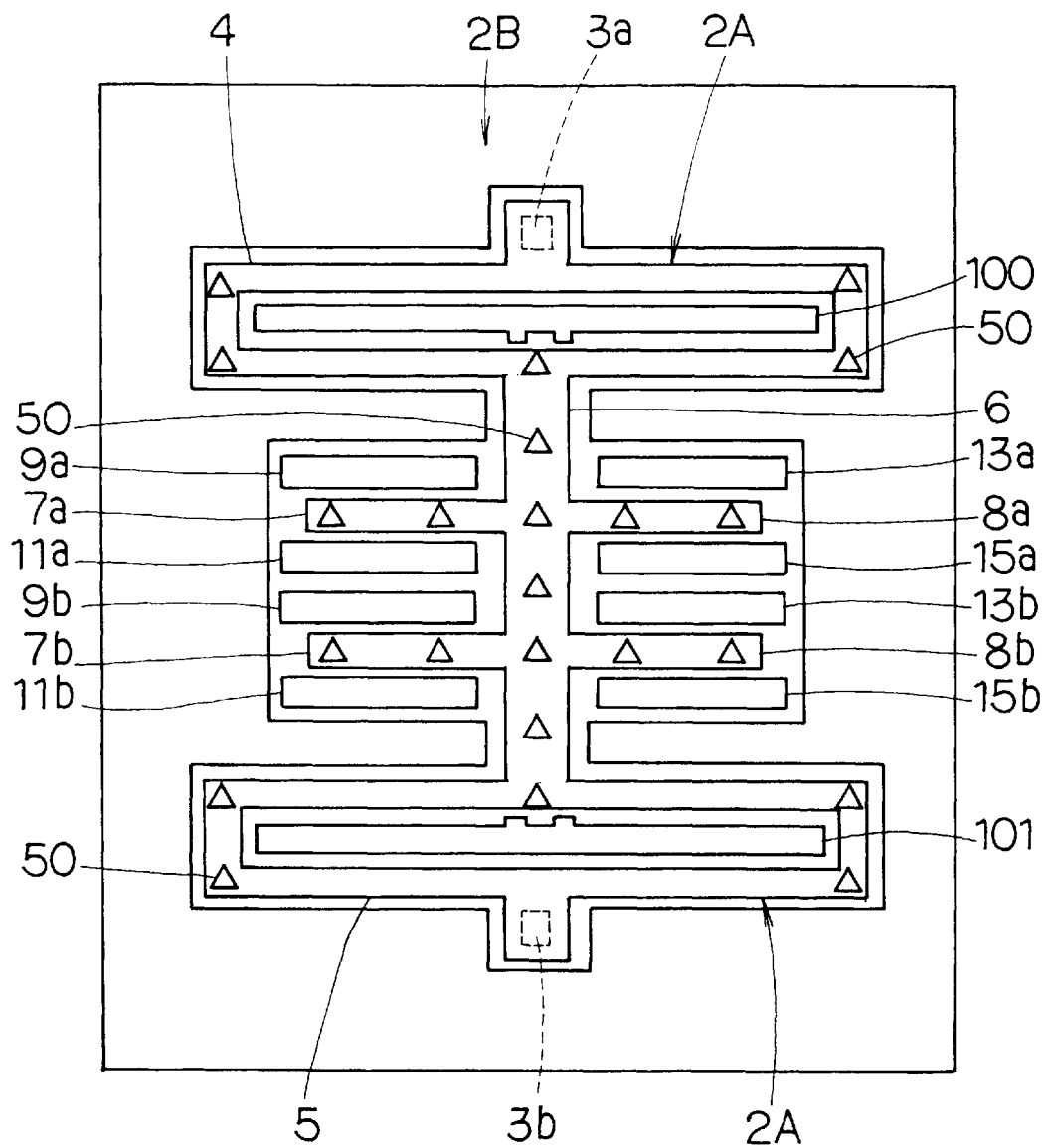
FIG. 8 is a plan view for explaining positions where stoppers are formed.
Figure 9:
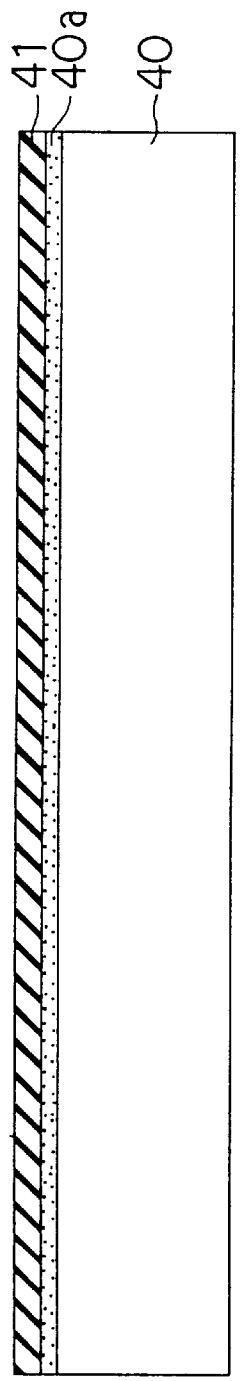

As shown in FIGS. 5 and 6, electrodes 51 (bonding pads) made of alumina are disposed above the anchor portions 3a, 3b. Further, in the first embodiment, several stoppers 50 partially protruding from the silicon nitride film 43 are disposed at the lower portion of beam structure 2A. In FIG. 8, the positions where the stoppers 50 are formed are indicated by triangle marks. As shown in the figure, the stopper 50 faces all of the beam portions 4, 5, the weight portion 6, and the movable electrodes 7a, 7b, 8a, 8b of the beam structure 2A at the lower portion thereof.

In the constitution described above, first and second capacitors are formed between the movable electrodes 7a, 7b and the first fixed electrodes 9a, 9b, and between the movable electrodes 7a, 7b and the second fixed electrodes 11a, 11b, respectively. Likewise, first and second capacitors are formed between the movable electrodes 8a, 8b and the first fixed electrodes 13a, 13b, and between the movable electrodes 8a, 8b and the second fixed electrodes 15a, 15b, respectively. The acceleration applied to the beam structure 2A is detected based on capacitance of the first and second capacitors. In more detail, two differential electrostatic capacitance are provided between the movable electrodes and the fixed electrodes, and a survo operation is carried out so that the two capacitance become equal to one another.

In the thus constructed and operated acceleration sensor, because the stoppers 50 face all of the beam portions 4, 5, the weight portion 6, and the movable electrodes 7a, 7b, 8a, 8b at the lower portion thereof, even when the beam structure 2A moves downward by its self-weight, the beam structure 2A only contacts the stoppers 50 having a small area. Therefore, in a dry step which is carried out after a sacrifice layer is etched, the beam structure 2A is not attached to the side of the silicon substrate 49.

Further, because the lower electrode 26 is connected to the beam portions 4, 5 and the weight portion 6 through the anchor portions 3a, 3b, the lower electrode 26 has the same electric potential as that of the beam structure 2A. Therefore, an electrostatic force is is not produced between the beam structure 2A and the substrate 1, so that the beam structure 2A is not attaced to the substrate 1 by the electrostatic force therebetween.

Further, the stopper portions 100, 101 having the protrusions 100b, 101b are provided inside of the beam portions 4, 5 having the bent type beams, and the gap between the movable electrodes and the fixed electrodes is larger than that between the protrusions 100b, 101b and the beam portions 4, 5. Therefore, even if the beam structure 2A is displaced in the direction A2, the movable electrodes do not contact the first and second fixed electrodes. Consequently, the movable electrodes can be prevented from being attached to the first and second fixed electrodes. Because the stopper portions 100, 101 are isolated from the beam structure 2A, even when the beam portions 4, 5 resonate, the stopper portions 100, 101 are not displaced, and the beam structure 2A does not move more than the gap between the movable electrodes and the first and second fixed electrodes. Accordingly, the movable electrodes can be prevented from being attached to the fixed electrodes even during the resonance.

The stopper portions 100, 101 are set at the same electric potential as that of the beam structure 2A via the anchor portions 100a, 101a. Therefore, an electrostatic force is not produced between the beam structure 2A and the stopper portions 100, 101. Accordingly, the beam structure 2A is not attached to the stopper portions 100, 101 by the electrostatic force therebetween. That is, the beam structure 2A can be prevented from being attached to the fixed portion 2B. In addition, because the stopper portions 100, 101 are formed separately from the beam portions 4, 5, the flexibility for forming the beam portions 4, 5 is high.

Next, a process for manufacturing the acceleration sensor in the first embodiment will be explained referring to FIGS. 9–15, which show manufacturing steps in a stepwise manner at a cross-section taken along a VI—VI line in FIG. 4.

[Step shown in FIG. 7]

First, a single crystal silicon substrate 40 is prepared as a first semiconductor substrate. The silicon substrate 40 is doped with n-type impurity ions, so that an $n^+$ type layer 40a for contact is formed in a surface region of the silicon substrate 40. After that, a silicon oxide film 41 as a sacrifice layer is deposited on the $n^+$ type layer 40a by thermal oxidation, a CVD method, or the like.

[Step shown in FIG. 8]

The silicon oxide film 41 is partially etched using a resist film 80, which is formed thereon by a photo-lithography technique to serve as an etching mask. Accordingly, recesses 42 for forming the stoppers 50 are provided.

[Step shown in FIG. 11]

The silicon nitride film 43 is then deposited on the silicon oxide film 41 to serve as an etching stopper when the sacrifice layer is etched. After that, opening portions 44a, 44b, 44c, 44d are formed in the laminated silicon oxide film 41 and the silicon nitride film 43 at positions where the anchor portions are to be formed, by dry etching or the like through a photo-lithography step. The opening portions 44a–44d are for connecting the beam structure 2A and the substrate (the lower electrode), and the fixed electrodes (the electrode output portions) and the wiring segments. Then, the polysilicon thin film 45 as the conductive thin film is deposited not only on the silicon nitride film 43 but also in the opening portions 44a–44d. After that, impurities such as phosphorus are doped into the polysilicon thin film 45 by diffusion or the like. The impurity doped polysilicon thin film 45 is patterned to have a wiring segment pattern 45a, a lower electrode 45b, and anchor portions 45c through a photo-lithography step. Further, the silicon nitride film 46 is deposited on the polysilicon thin film 45 and on the exposed silicon nitride film 43, and the silicon oxide film 47 is deposited on the silicon nitride film 46 by the CVD method or the like.

[Step shown in FIG. 12]

Then, the polysilicon thin film 48 for bonding is deposited on the silicon oxide film 47, and the surface of the polysilicon thin film 48 is polished to be flattened.

Figure 13:
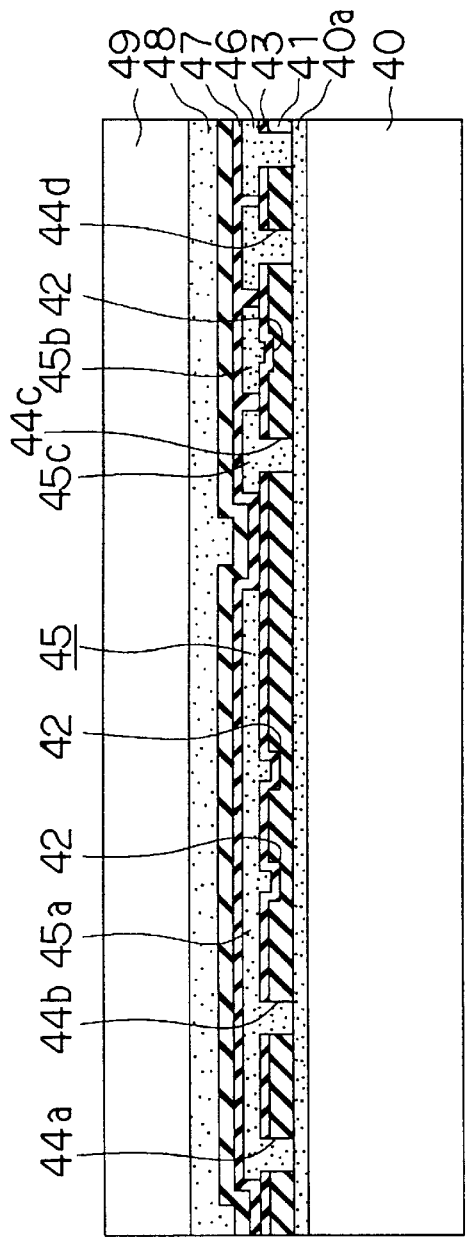

[Step shown in FIG. 13]

Another single crystal silicon substrate (support plate) 49 is prepared, and is bonded to the polished surface of the polysilicon thin film 48.

Figure 14:
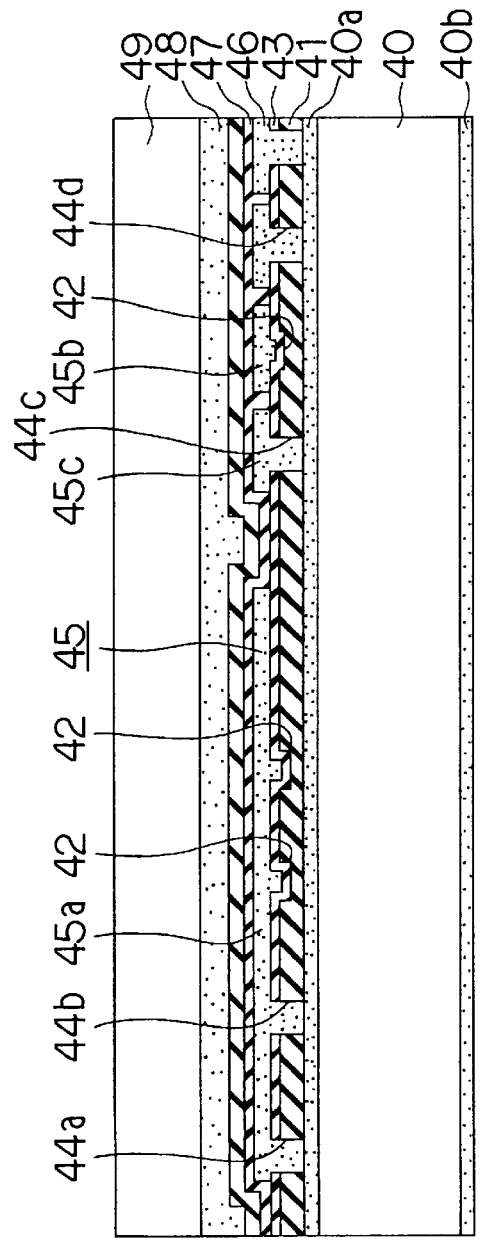

[Step shown in FIG. 14]

Next, the surface of the silicon substrate 40 on a side opposite to the silicon substrate 49 is polished so that the silicon substrate 40 is thinned to have a desired thickness (for example, 2 μm to 20 μm. After that, n-type impurities are doped into the silicon substrate 40 so that an n⁺-type layer 40b for contact is formed in the surface region of the silicon substrate 40.

Figure 15:
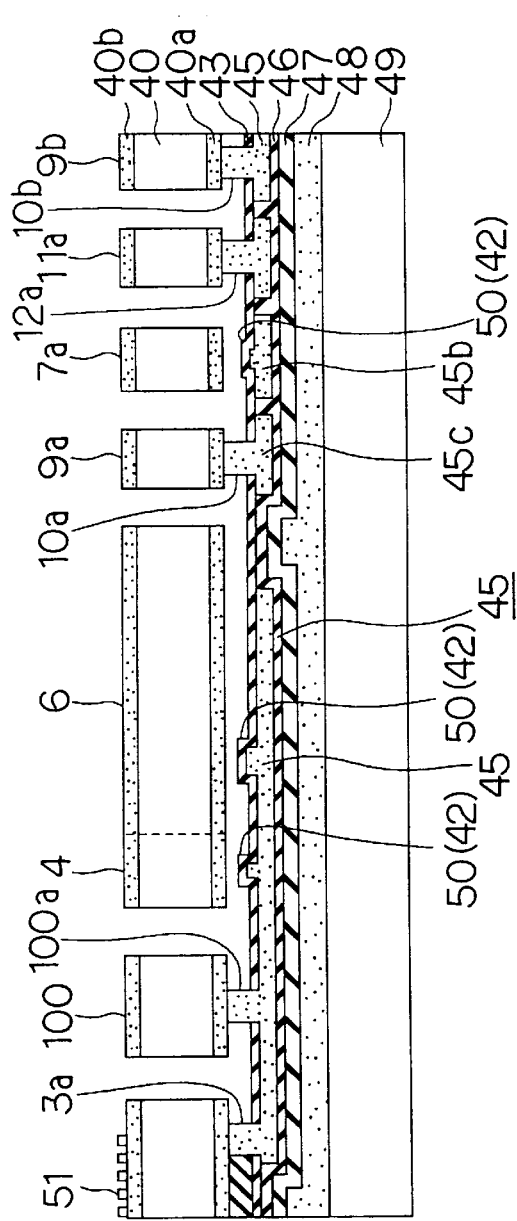

[Step shown in FIG. 15]

After the electrodes (pads) 51 are formed on the specific region of the silicon substrate 40, the silicon substrate 40 is etched through a photo-lithography step so that several trenches having a constant width are formed in the substrate 40 to form the beam portions 4, 5, the weight portion 6, the movable electrodes and the first and second fixed electrodes. In this step, impurities such as phosphorus are diffused into the silicon substrate 40 such that the silicon substrate 40 can serve as an electrode for detecting the electrostatic capacity.

Figure 16:
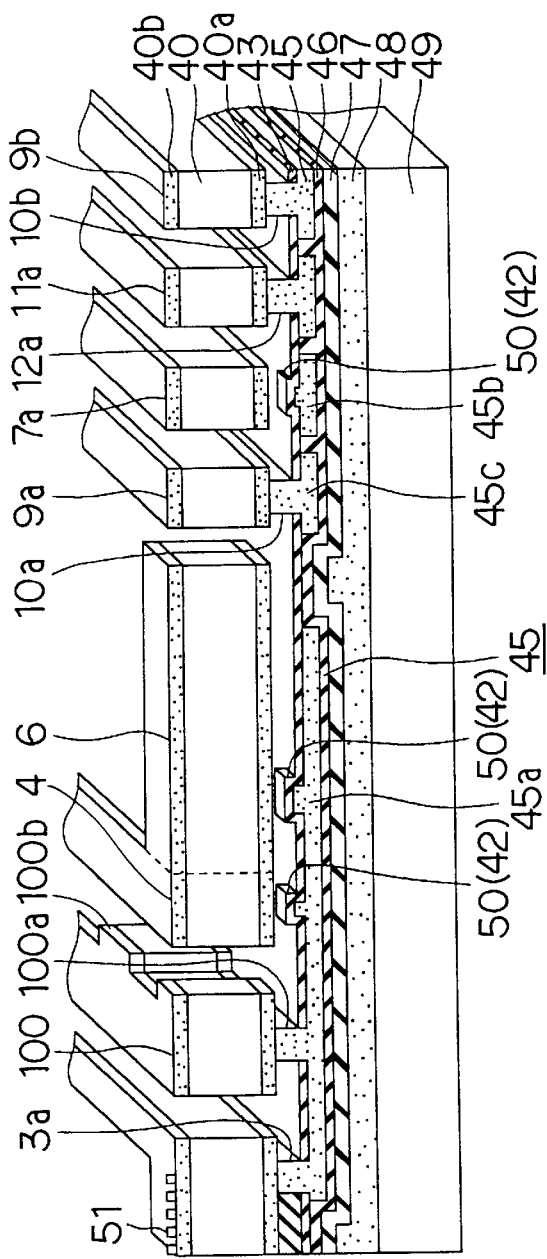
FIG. 16 is a perspective cross-sectional view partially showing the acceleration sensor in the first embodiment.

Successively, the sacrifice layer 41 is etched using HF based etching solution to be removed. Accordingly, the beam structure 2A composed of the beam portions 4, 5, the weight portion 6, and the movable electrodes 7a, 7b, 8a, 8b is released to be movable. The portions where the recesses 43 are formed provide the stoppers 50 partially protruding from the silicon nitride film 43. At that time, sublimation agent such as paradichlorobenzene is used to prevent the movable portion from being attaced to the substrate during the dry step after the etching. In this way, the acceleration sensor in which the wiring segments and the lower electrode are formed by isolation is manufactured using a buried SOI substrate. Incidientally, FIG. 16 is a perspective view partially showing the acceleration sensor manufactured by the process described above.

In the first embodiment, the silicon oxide film is used as the sacriface layer 41 and the polysilicon thin film is used as the conductive thin film 45. Therefore, when the HF based etching solution is used in the sacriface layer etching step, the sacriface layer etching can be easily carried out without precisely controlling a concentration and a temperature of the etching solution, etching time for stopping the etching, and the like. This is because the polysilicon thin film is not dissolved by HF.

Figure 10:
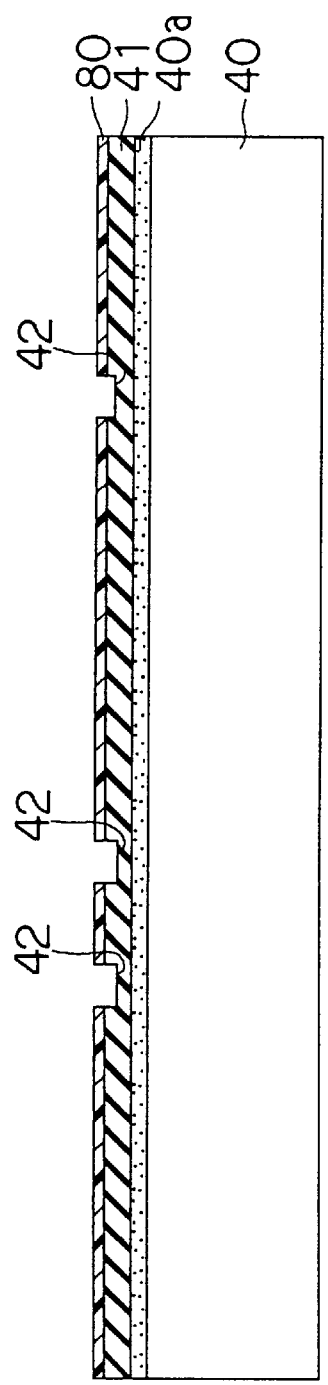

The stoppers 50 shown in FIG. 6 is formed utilizing the recesses 42 shown in FIG. 10 by the sacriface layer etching step. Therefore, although drops of rinse (substitutional solution) such as demineralized water are liable to remain between the beam structure 2A and the substrate 1 during a substitution step for the etching solution, each contact area of the drops is decreased so that surface tension by the drops is decreased. Accordingly, the movable portion is prevented from being attached to the substrate even when the drops evaporate.

(Second Embodiment)

Figure 17:
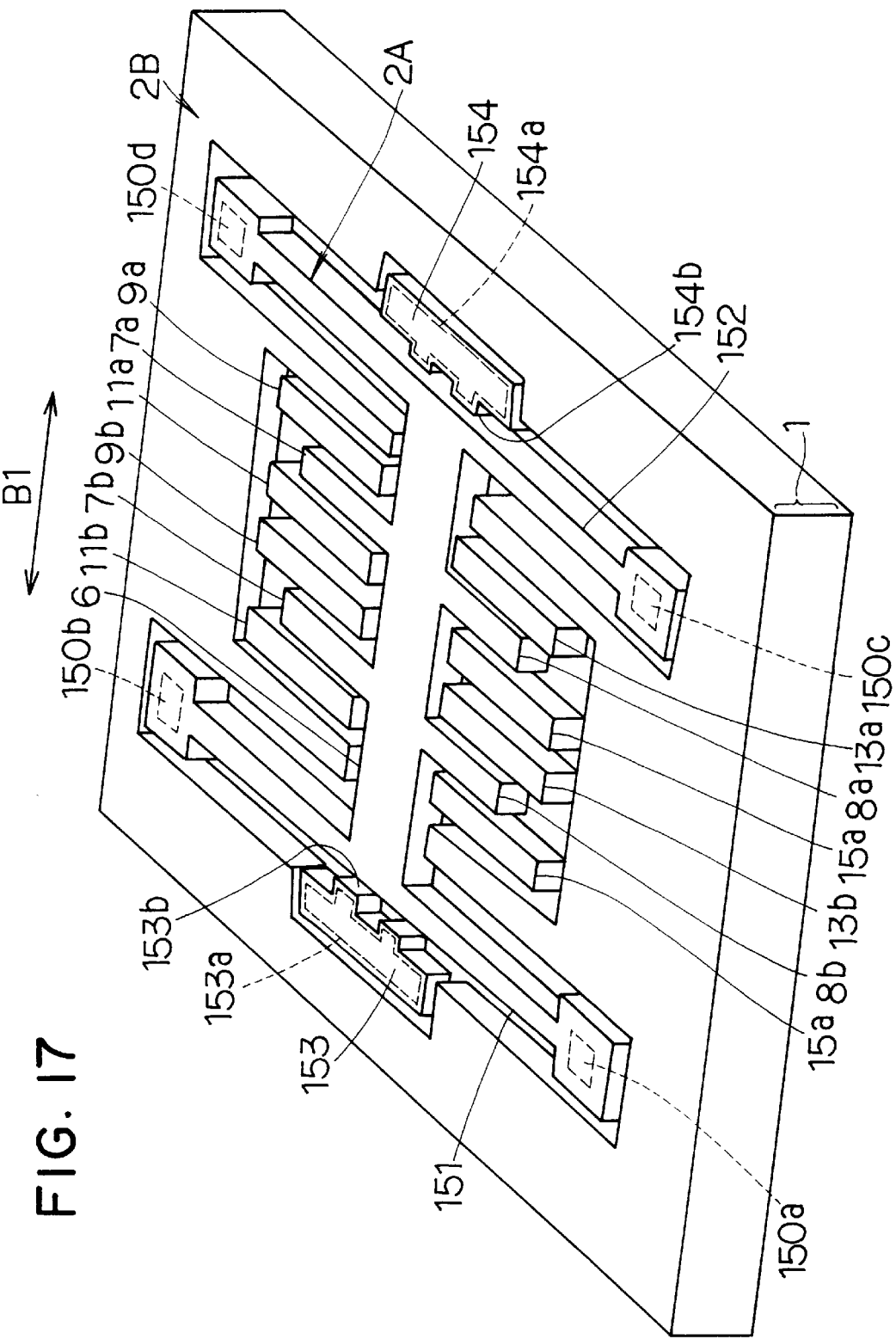
FIG. 17 is a perspective view showing an acceleration sensor in a second preferred embodiment.

Next, an acceleration sensor in a second preferred embodiment will be explained referring to FIG. 17. The same parts and components as in the first embodiment will be indicated with the same reference numerals and only parts different from the first embodiment will be described.

The beam structure 2A is supported by four anchor portions 150a–150d protruding from the substrate 1, and disposed above the upper surface of the substrate 1 with a specific gap therebetween. The anchor portions 150a–150d are formed from a polysilicon thin film. A beam portion 151 is provided between the anchor portions 150a, 150b, and a beam portion 152 is provided between the anchor portions 150c, 150d. The weight portion 6 is provided between the beam portions 151, 152. Each of the beam portions 151, 152 is composed of one beam.

A stopper portion 153 is disposed on a side opposite to the weight portion 6 with respect to the beam portion 151, and a stopper portion 154 is disposed on a side opposite to the weight portion 6 with respect to the beam portion 152. The stopper portions 153, 154 respectively have protrusions 153b, 154b facing the beam portions 151, 152 for restricting the movement of the beam structure 2A in a direction B1 in FIG. 17. The stopper portions 153, 154 are isolated from the beam structure 2A and from the fixed portion 2B, and are fixed to the substrate 1 via anchor portions 153a, 154a. The stopper portions 153, 154 are electrically connected to the beam structure 2A through the anchor portions 150a–150d, so that the stopper portions 153, 154 have the same electric potential as that of the beam structure 2A not to cause the potential difference which produced an electrostatic force therebetween. As a result, the beam structure 2A is prevented from being attached to the stopper portions 153, 154 by the electrostatic force.

As described above, the stopper portions 153, 154 are formed with the protrusions 153b, 154b partially protruding to reduce a contact area with the beam portions 151, 152. Therefore, the protrusions 153b, 154b substantially serve as stoppers. The protrusions 153b, 154b are formed to define a specific gap (for example, 2 μm) with the ends of the beam portions 151, 152, respectively. Therefore, the beam structure 2A cannot move more than the specific gap. The gap between the movable electrodes and the corresponding first or second fixed electrodes is larger than that between the protrusions 153b, 154b and the beam portions 151, 152. Accordingly, when the beam structure 2A is displaced, the movable electrodes are not be attached to the fixed electrodes. As a result, the acceleration sensor shown in FIG. 17 can provide the same effects as those in the first embodiment.

Incidentally, it is possible for the stopper portions 153, 154 to be isolated from the fixed portion 2B. At that time, the stopper portions 153, 154 can be made to have the same electric potential as that of the beam structure 2A through pads provided at specific portions of the fixed portion 2B. However, in the case where the electric potential applied to one of the beam structure 2A and the fixed portion 2B changes, there arise a potential difference between the stopper portions 153, 154 and the beam structure 2A. This problem can be solved by directly and electrically connecting the beam structure 2A and the stopper portions 153, 154.

Also, when the stopper portions 153, 154 are integrated with the fixed portion 2B, the stopper portions 153, 154 can be made to have the same electric potential as that of the beam structure 2A via a diffusion layer or the like. In this case, a potential difference is produced due to a diffusion resistance and the like. Therefore, it is difficult that the stopper portions 153, 154 are set to have the same electric potential in accordance with a distance from the pads. As opposed to this, in the second embodiment, because the stopper portions 153, 154 are isolated from the fixed portion 2B, the stopper portions 153, 154 can be precisely set at the same electric potential as that of the beam structure 2A.

In the first and second embodiments, although respective two protrusions 100b, 101b, 153b, 154b are provided on an opposite side of the weight portion 6 with respect to the beam portions 4, 5, 151, 152, the number of the protrusions 100b, 101b, 153b, 154b may be more than two. The protrusions can be arranged in the longitudinal directions of the beam portions 4, 5, 151, 152. Further, although the stopper portions 100, 101, 153, 154 are electrically connected to the beam structure 2A through the polysilicon thin film, the stopper portions may be connected to the beam structure 2A through a thermal diffusion layer or the like.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor sensor for detecting a physical quantity, comprising:
   a substrate having first and second anchor portions thereon;
   a movable portion for being displaced generally in a direction parallel to a surface of the substrate by the physical quantity, the movable portion being disposed above the substrate and including a beam portion, a mass portion, and a movable electrode, the mass portion being supported by the first anchor portion through the beam portion;
   a fixed electrode fixed to the substrate and facing the movable electrode of the mass portion; and
   a stopper portion, for restricting displacement of the mass portion, the stopper portion being fixed to the substrate through the second anchor portion separately from the movable portion, the stopper portion being electrically connected to the beam portion through the first and second anchor portions.

2. The semiconductor sensor of claim 1, wherein the substrate has an electrode pattern made of polysilicon that electrically connects the first and second anchor portions.

3. The semiconductor sensor of claim 1, wherein the stopper portion is provided on a side opposite to the mass portion with respect to the beam portion.

4. The semiconductor sensor of claim 3, wherein:
   the beam portion is a polygonally shaped beam including an inner beam cavity therein; and
   the stopper portion is disposed in the inner beam cavity.

5. The semiconductor sensor of claim 3, wherein the stopper portion is isolated from the beam portion.

6. The semiconductor sensor of claim 3, wherein the stopper portion has a protrusion protruding toward the beam portion for restricting the displacement of the mass portion.

7. The semiconductor sensor of claim 3, wherein:
   the fixed electrode and the movable electrode define a first gap therebetween; and
   the stopper portion and the beam portion define a second gap therebetween, the second gap being larger than the first gap.

8. The semiconductor sensor of claim 7, wherein the stopper portion has a protrusion protruding toward the beam portion and defining the second gap with the beam portion.

9. The semiconductor sensor of claim 1, wherein the substrate has a plurality of protrusions respectively facing the beam portion, the movable electrode and the mass portion.

10. The semiconductor sensor of claim 1, wherein the substrate has an electrode pattern facing the mass portion and electrically connected to the movable portion through the first anchor portion to have an electric potential equal to that of the movable portion.

11. The semiconductor sensor of claim 10, wherein the electrode pattern faces all of the mass portion, the movable electrode and the beam portion.

12. The semiconductor sensor of claim 11, wherein the electrode pattern has a plurality of protrusions respectively facing the mass portion, the movable electrode and the beam portion.

13. A semiconductor sensor for detecting a physical quantity, comprising:
   a substrate having an anchor portion thereon;
   a movable portion including a beam portion, a mass portion, and a movable electrode, the movable portion being suspended above the substrate and being displaced by the physical quantity, the mass portion being supported by the anchor portion through the beam portion;
   a fixed electrode fixed to the substrate and facing the movable electrode,
   wherein the substrate has an electrode pattern facing the movable portion with a gap interposed therebetween, the electrode pattern being electrically connected to the movable portion through the anchor portion to have an electric potential equal to that of the movable portion.

14. The semiconductor sensor of claim 13, wherein the electrode pattern faces the entire surface of the mass portion, the movable electrode and the beam portion.

15. The semiconductor sensor of claim 14, wherein the electrode pattern has a plurality of protrusions facing the mass portion, the movable electrode and the beam portion.

16. The semiconductor sensor of claim 13, wherein the electrode pattern has a shape generally the same as that of the movable portion.

17. A semiconductor sensor for detecting a physical quantity, comprising:
   a substrate having an anchor portion protruding therefrom and an electrode pattern;
   a movable portion for being displaced by the physical quantity, the movable portion including a beam portion, a mass portion, and a movable electrode, and the movable portion being disposed above the substrate to face the electrode pattern with a first gap interposed therebetween, the mass portion being supported by the anchor portion through the beam portion;
   a fixed electrode fixed to the substrate and facing the movable electrode with a second gap interposed therebetween; and
   a stopper portion fixed to the substrate and facing the beam portion with a third gap interposed therebetween on a side opposite to the mass portion,
   wherein the stopper portion and the electrode pattern are electrically connected to the beam portion through the anchor portion to restrict displacement of the movable portion in directions generally parallel to a surface of the substrate and generally perpendicular to the surface.

18. The semiconductor sensor of claim 17, wherein the third gap is larger than the second gap.

19. The semiconductor sensor of claim 17, wherein the stopper portion has a stopper protrusion facing the beam portion with the third gap interposed therebetween.

20. The semiconductor sensor of claim 17, wherein:
   the electrode pattern has a plurality of protrusions facing the movable portion with the first gap interposed therebetween.

21. The semiconductor sensor of claim 1, wherein the stopper portion is non-movable even when the movable portion abuts the stopper portion.

22. The semiconductor sensor of claim 1, wherein the stopper portion faces the mass portion in a displacement direction in which the movable portion is displaced.

23. The semiconductor sensor of claim 22, wherein the stopper portion extends in a direction perpendicular to the displacement direction.

24. The semiconductor sensor of claim 6, wherein the protrusion faces the mass portion in a displacement direction in which the movable portion is displaced.

25. The semiconductor sensor of claim 8, wherein the protrusion faces the mass portion in a displacement direction in which the movable portion is displaced.

26. The semiconductor sensor of claim 1, wherein:
the stopper portion has first and second stopper portions respectively facing the mass portion on both sides of the mass portion in a displacement direction in which the movable portion is displaced.

27. A semiconductor sensor for detecting a physical quantity, comprising:
a substrate;
a movable portion movably supported on the substrate and having a movable electrode; and
a fixed portion fixed non-movably to the substrate and separated from the movable portion, the fixed portion including a fixed electrode facing the movable electrode to detect the physical quantity, and a stopper portion facing a part of the movable portion for restricting displacement of the movable portion, the stopper portion having an electric potential approximately equal to that of the movable portion.

28. The semiconductor sensor of claim 27, wherein:
the movable portion has a mass portion which is displaced together with the movable electrode in a displacement direction approximately parallel to a surface of the substrate; and
wherein the stopper portion faces the movable portion with a specific gap in the displacement direction.

29. The semiconductor sensor of claim 28, wherein the stopper portion has a protrusion facing the movable portion with the specific gap.

30. The semiconductor sensor of claim 27, wherein the substrate has an electrode pattern facing the movable portion in a direction perpendicular to a surface thereof and having an electric potential approximately equal to that of the movable portion.

* * * * *